(12) United States Patent
Ma et al.

(10) Patent No.: US 11,139,168 B2
(45) Date of Patent: Oct. 5, 2021

(54) CHAMBER DEPOSITION AND ETCH PROCESS

(71) Applicant: Applied Materials, Inc., Santa Clara, CA (US)

(72) Inventors: Jun Ma, Milpitas, CA (US); Amit Bansal, Milpitas, CA (US); Tuan A. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 16/700,758

(22) Filed: Dec. 2, 2019

(65) Prior Publication Data

US 2021/0166942 A1 Jun. 3, 2021

(51) Int. Cl.
*H01L 21/033* (2006.01)
*H01L 21/02* (2006.01)
*H01L 21/311* (2006.01)

(52) U.S. Cl.
CPC .... *H01L 21/0337* (2013.01); *H01L 21/02087* (2013.01); *H01L 21/02115* (2013.01); *H01L 21/02274* (2013.01); *H01L 21/0332* (2013.01); *H01L 21/0335* (2013.01); *H01L 21/31122* (2013.01)

(58) Field of Classification Search
None
See application file for complete search history.

(56) References Cited

U.S. PATENT DOCUMENTS

| 2008/0050923 | A1 | 2/2008 | Kim et al. | |
| 2008/0227301 | A1* | 9/2008 | Fang | H01L 21/3065 438/706 |
| 2009/0014127 | A1 | 1/2009 | Shah et al. | |
| 2009/0293907 | A1* | 12/2009 | Fung | H01L 21/67069 134/1.2 |
| 2009/0302002 | A1* | 12/2009 | Collins | H01L 21/31138 216/67 |

(Continued)

FOREIGN PATENT DOCUMENTS

| KR | 10-0572131 B1 | 4/2006 |
| KR | 2006-0060997 A | 6/2006 |
| KR | 10-1342989 B1 | 12/2013 |

OTHER PUBLICATIONS

International Search Report and Written Opinion dated Mar. 23, 2021 in International Patent Application No. PCT/US2020/062595, 9 pages.

*Primary Examiner* — Evren Seven
(74) *Attorney, Agent, or Firm* — Kilpatrick Townsend & Stockton LLP

(57) ABSTRACT

Exemplary methods of semiconductor processing may include depositing a material on a substrate seated on a substrate support housed in a processing region of a semiconductor processing chamber. The processing region may be at least partially defined by the substrate support and a faceplate. The substrate support may be at a first position within the processing region relative to the faceplate. The methods may include translating the substrate support to a second position relative to the faceplate. The methods may include forming a plasma of an etchant precursor within the processing region of the semiconductor processing chamber. The methods may include etching an edge region of the substrate.

20 Claims, 4 Drawing Sheets

(56) References Cited

U.S. PATENT DOCUMENTS

| | | | |
|---|---|---|---|
| 2011/0168672 A1* | 7/2011 | Harte | B23K 26/0676 |
| | | | 216/65 |
| 2019/0252236 A1* | 8/2019 | Igarashi | H01L 21/67051 |
| 2020/0127090 A1* | 4/2020 | Yamamoto | H01L 29/2003 |
| 2021/0143005 A1* | 5/2021 | Nguyen | H01L 21/68785 |
| 2021/0151297 A1* | 5/2021 | Chen | H01L 21/67069 |

* cited by examiner

CHAMBER DEPOSITION AND ETCH PROCESS

TECHNICAL FIELD

The present technology relates to methods and components for semiconductor processing. More specifically, the present technology relates to systems and methods for producing hardmask films.

BACKGROUND

Integrated circuits are made possible by processes which produce intricately patterned material layers on substrate surfaces. Producing patterned material on a substrate requires controlled methods for forming and removing material. As device sizes continue to reduce, aspect ratios of structures may grow, and maintaining dimensions of these structures during removal operations may be challenged. To facilitate patterning of materials on a substrate, hardmasks may be employed. As the number of material layers being patterned is expanding, hardmask use and selectivity to multiple materials is becoming more important.

Thus, there is a need for improved systems and methods that can be used to produce high quality devices and structures. These and other needs are addressed by the present technology.

SUMMARY

Exemplary methods of semiconductor processing may include depositing a material on a substrate seated on a substrate support housed in a processing region of a semiconductor processing chamber. The processing region may be at least partially defined by the substrate support and a faceplate. The substrate support may be at a first position within the processing region relative to the faceplate. The methods may include translating the substrate support to a second position relative to the faceplate. The methods may include forming a plasma of an etchant precursor within the processing region of the semiconductor processing chamber. The methods may include etching an edge region of the substrate.

In some embodiments, the depositing may include delivering a carbon-containing precursor to the processing region of the semiconductor processing chamber. The depositing may include forming a plasma of the carbon-containing precursor, and depositing a carbon-containing material on the substrate. The etchant precursor may be or include an oxygen-containing precursor. A distance between the substrate support and the faceplate at the second position may be less than a distance between the substrate support and the faceplate at the first position. A surface of the substrate facing the faceplate may be positioned less than or about 5 mm from the faceplate when the substrate support is in the second position. The substrate support may be characterized by a recessed ledge at an exterior edge of the substrate support. A surface of the substrate support facing the faceplate at the recessed ledge may be positioned greater than or about 2 mm from the faceplate when the substrate support is in the second position. Forming the plasma of the etchant precursor may include forming an annular plasma about an edge region of the substrate support. Etching the edge region of the substrate may perform an etch substantially limited to a distance extending less than or about 50 mm from an exterior edge of the substrate.

Some embodiments of the present technology may encompass semiconductor processing methods. The methods may include depositing a material on a substrate seated on a substrate support housed in a processing region of a semiconductor processing chamber. The processing region may be at least partially defined by the substrate support and a faceplate. The substrate support may be characterized by a recessed ledge at an exterior edge of the substrate support. The methods may include raising the substrate support to a position where a surface of the substrate facing the faceplate may be positioned less than or about 5 mm from the faceplate. The methods may include forming a plasma of an etchant precursor within the processing region of the semiconductor processing chamber. The methods may include etching an edge region of the substrate while substantially maintaining the material deposited at a central region of the substrate.

In some embodiments, the material deposited on the substrate may be or include a carbon-containing hardmask. Forming a plasma of an etchant precursor may include flowing an oxygen-containing precursor into the processing region of the semiconductor processing chamber. The methods may include forming a plasma of the oxygen-containing precursor, and etching the material deposited on the substrate with plasma effluents of the oxygen-containing precursor. Raising the substrate support may position the surface of the substrate facing the faceplate less than or about 2 mm from the faceplate. Forming the plasma of the etchant precursor may include forming an annular plasma about an edge region of the substrate support. Etching the edge region of the substrate may perform an etch substantially limited to a distance extending less than or about 50 mm from an exterior edge of the substrate. The methods may include, subsequent depositing the material, reducing a pressure in the semiconductor processing chamber to purge the processing region of the semiconductor processing chamber. The substrate support may be characterized by a tilt during deposition, and the method may include leveling the substrate support so the substrate is substantially parallel with the faceplate.

Some embodiments of the present technology may encompass semiconductor processing methods. The methods may include forming a plasma of a carbon-containing precursor in a processing region of a semiconductor processing chamber. The processing region may be at least partially defined by a substrate support and a faceplate. The methods may include depositing a carbon-containing material on a substrate disposed on the substrate support. The substrate support may be at a first position within the processing region relative to the faceplate. The methods may include raising the substrate support to a second position relative to the faceplate. The methods may include forming an annular plasma of an oxygen-containing precursor within the processing region of the semiconductor processing chamber. The methods may include etching an edge region of the substrate.

In some embodiments, the substrate support may include positioning tabs to maintain the substrate on the substrate support. The substrate support may be characterized by a recessed ledge at an exterior edge of the substrate support radially outward of a region on which the substrate is disposed. A surface of the substrate facing the faceplate may be less than or about 2 mm from the faceplate when the substrate support is in the second position. A surface of the substrate support facing the faceplate at the recessed ledge may be greater than or about 2 mm from the faceplate when the substrate support is in the second position.

Such technology may provide numerous benefits over conventional systems and techniques. For example, embodiments of the present technology may perform deposition and etch processes within a single processing chamber, which may reduce processing queue times. Additionally, the present technology may reduce peeling of formed films by performing a bevel etch. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
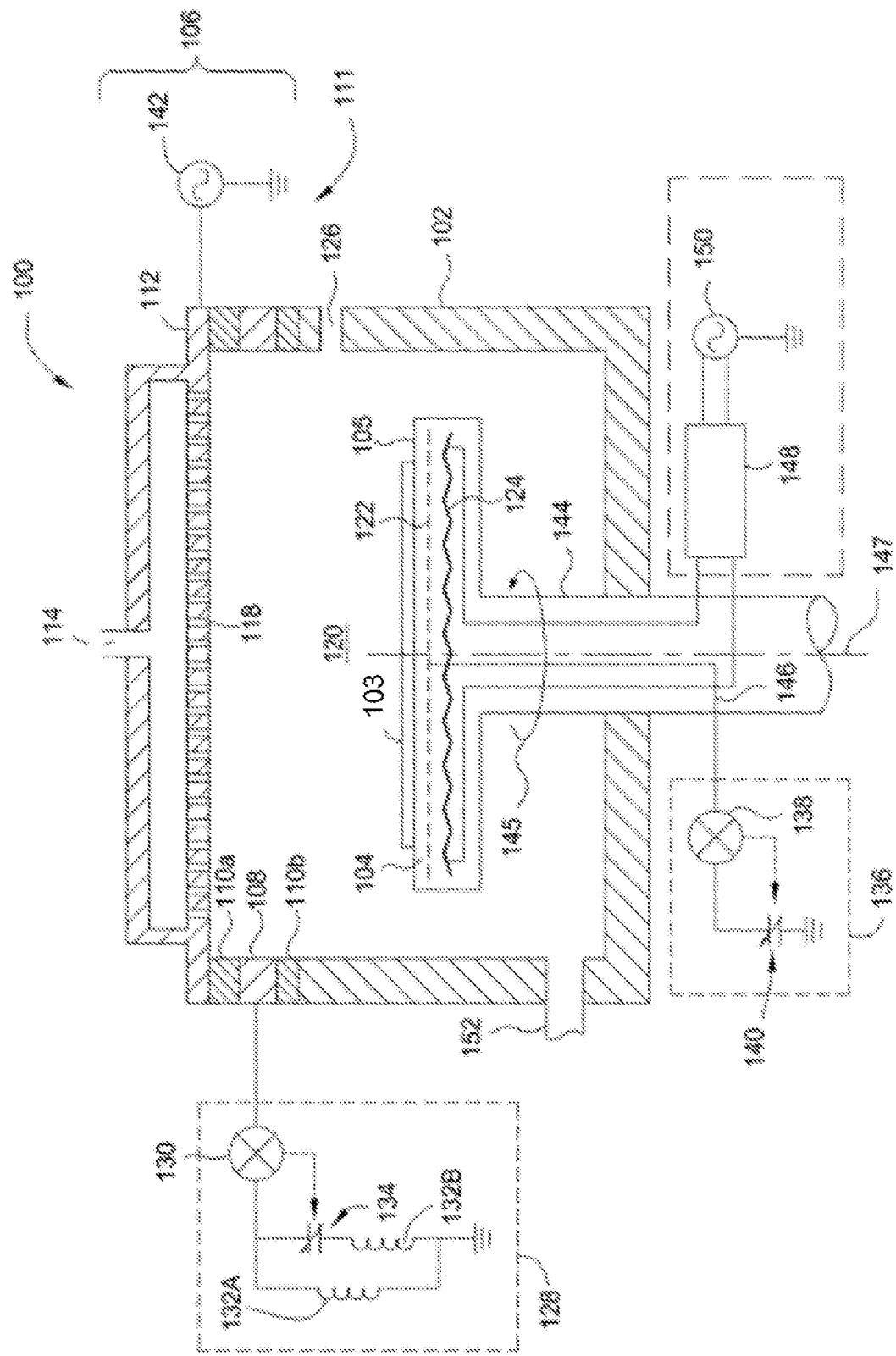
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. Within the processing region, a plasma may be ignited, which produces materials for deposition. In a non-limiting example for carbon-containing films, the plasma deposition may also occur under relatively higher temperatures, which may facilitate adsorption of carbon radicals on to the surface of the substrate.

Deposition of this kind may produce films that can extend into edge regions of the substrate, and may also extend over a bevel exterior edge of the substrate. This material may be characterized by reduced adhesion relative to material deposited on the exposed substrate surfaces. Additionally, hydrogen may be incorporated into the film, which may further reduce adhesion during processing. Subsequent operations may include a lithography, and in one non-limiting lithographic technique, immersion lithography may be used. Immersion lithography may replace an air gap between a final lens of the tool and the substrate surface with a liquid medium that has a refractive index greater than one. The resolution of the technique may be increased over air by a factor equal to the refractive index of the liquid. Some immersion lithography techniques may utilize a purified water as the liquid medium. The aqueous medium may be characterized by a surface tension, which may further increase the opportunity for delamination of hardmask films that may be characterized by lower adhesion, such as around bevel edges of the substrate.

To limit this effect, an edge etch may be performed on the substrate to remove residual material on the bevel of the substrate. A process may be performed in a load lock or other etch chamber that etches the edge region after transferring the substrate that includes the deposited material from a deposition processing chamber. Such an etch process may be limited as many platforms include more deposition chambers than load locks. Additionally, multiple pump down operations may also be performed further slowing substrate throughput.

The present technology overcomes these issues by performing in situ etch processes after finishing the deposition. The present technology may utilize a modified substrate support in some embodiments, which may facilitate controlling an etch plasma. Additionally, by performing the etch directly after deposition, throughput issues may be resolved for multi-chamber systems.

Although the remaining disclosure will routinely identify specific deposition processes utilizing the disclosed technology, it will be readily understood that the systems and methods are equally applicable to other deposition, etch, and cleaning chambers, as well as processes as may occur in the described chambers. Accordingly, the technology should not be considered to be so limited as for use with these specific deposition processes or chambers alone. The disclosure will discuss one possible chamber that may be used to perform processes according to embodiments of the present technology before additional variations and adjustments to this system according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. For example, in some embodiments as will be described further below, first electrode 108 may be a faceplate. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
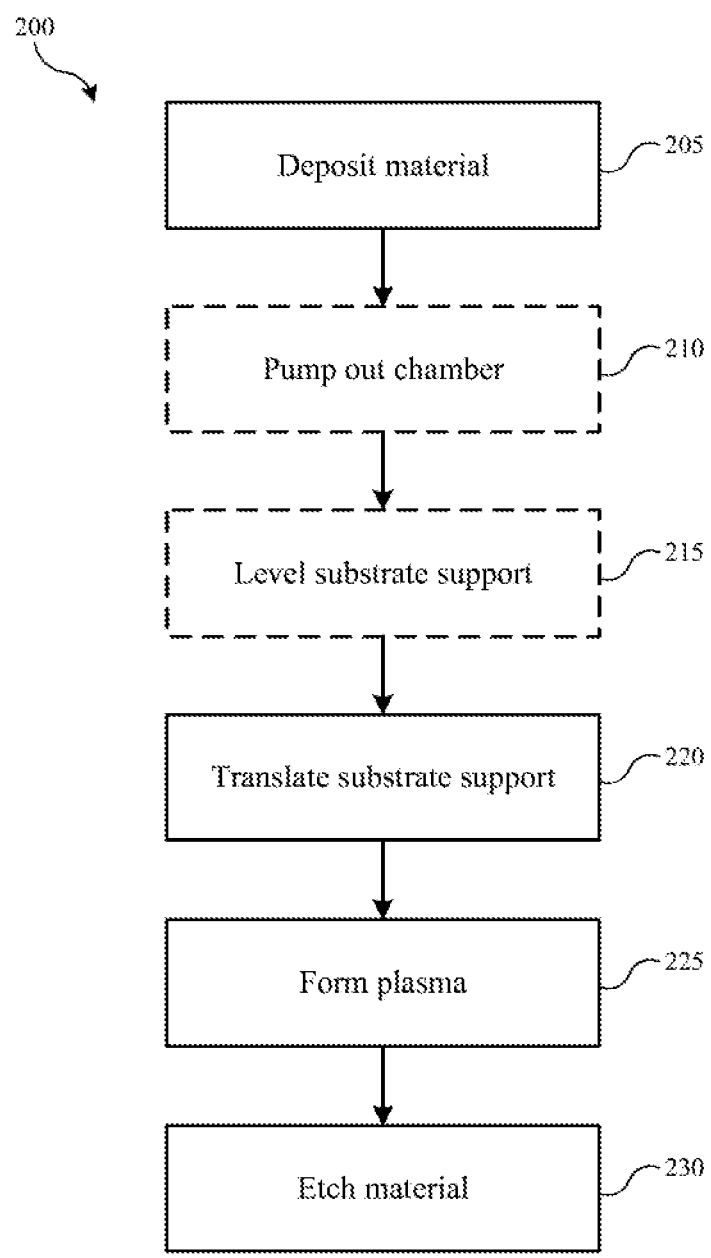
FIG. 2 shows operations in a semiconductor processing method according to some embodiments of the present technology.

FIG. 2 shows exemplary operations in a processing method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown being performed in a processing chamber 300 shown schematically in FIGS. 3A-3B, the illustrations of which will be described in conjunction with the operations of method 200. Chamber 300 may include any aspect of chamber 100 described above. It is to be understood that the figures illustrate only partial schematic views, and a substrate may contain any number of structural sections having aspects as illustrated in the figures, as well as alternative structural aspects that may still benefit from operations of the present technology.

Figure 3A:
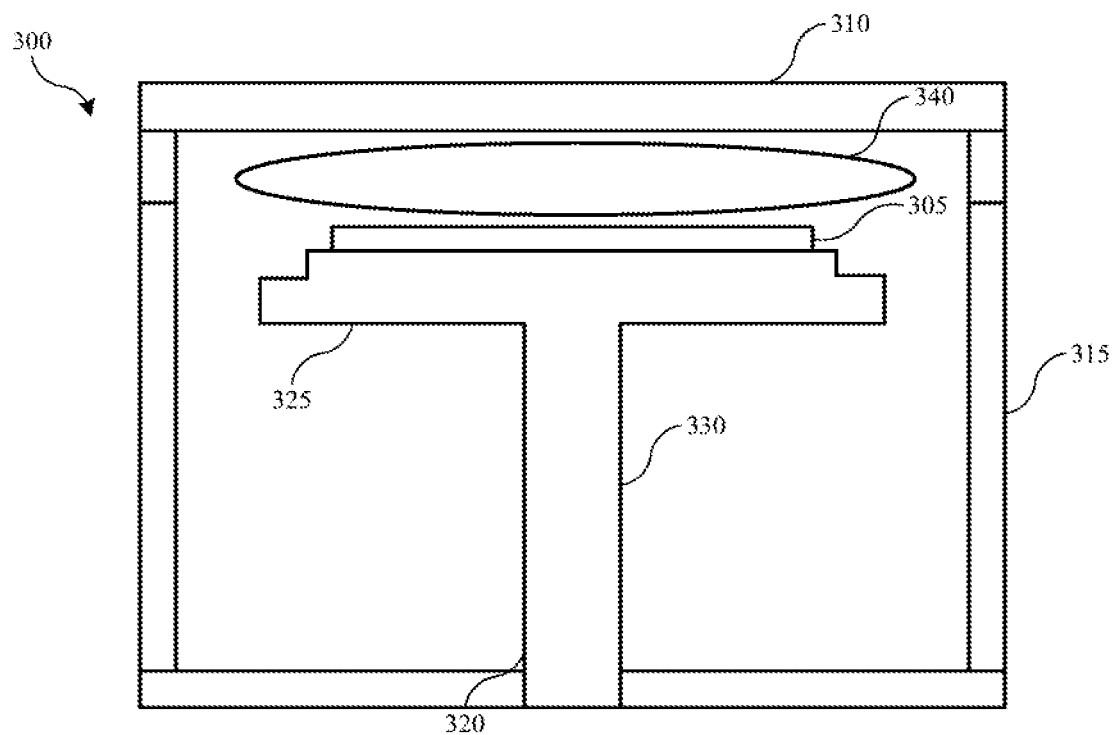
FIG. 3A shows a schematic cross-sectional view of an exemplary plasma chamber during an exemplary deposition operation according to some embodiments of the present technology.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above. An exemplary substrate 305 is illustrated in FIG. 3A, and may be or include aspects of a substrate on which operations according to the present technology may be performed.

The substrate 305 may be any number of materials on which materials may be deposited. The substrate may be or include silicon, germanium, dielectric materials including silicon oxide or silicon nitride, metal materials, or any number of combinations of these materials, which may be the substrate 305, or materials formed on substrate 305. Chamber 300 may include a processing chamber including a faceplate 310, through which precursors may be delivered for processing, and which may be coupled with a power source for generating a plasma within the processing region of the chamber. The chamber may also include a chamber body 315, which as illustrated may include sidewalls and a base. A pedestal or substrate support 320 may extend through the base of the chamber as previously discussed. A processing region may be at least partially defined between the pedestal, the faceplate, and/or the chamber walls. The substrate support may include a support platen 325, which may support semiconductor substrate 305. The support platen 325 may be coupled with a shaft 330, which may extend through the base of the chamber.

Method 200 may include a processing method that may include a number of operations for preparing a chamber for processing, and forming a hardmask film or other deposition operations, although any other deposition processes may similarly be encompassed by the present technology. At operation 205, a material may be deposited on the substrate. During the deposition, the substrate support 320 may be located at a first position, which may be a first vertical position relative to the faceplate 310. The position may be any distance from the faceplate that facilitates development of a plasma across the substrate support as illustrated in the figure. The substrate may also be tilted in some operations, which may facilitate improved uniformity to account for a chamber signature. The first position of the substrate may be a height configured to produce a plasma volume 340 between the faceplate and the substrate support, where a capacitively-coupled plasma may be produced.

In one non-limiting embodiment, the deposition may be a hardmask deposition, such as for a carbon-containing hardmask. A carbon-containing precursor may be delivered to the processing region, and a plasma may be generated to produce carbon-containing radicals, which may be deposited or adsorbed on a substrate to produce a carbon-containing film, such as a hardmask. Any carbon-containing material may be used in the deposition, and the carbon-containing precursor may be or include any alkane, alkene, or any other carbon-containing material. The precursor may include carbon-and-hydrogen-containing precursors, which may include any amount of carbon and hydrogen bonding. In some embodiments the carbon-containing precursor may consist of carbon-to-carbon and carbon-and-hydrogen bonding. The deposition may occur uniformly, or relatively uniformly, over the substrate, and may extend into edge regions, including over or to a bevel edge of the substrate.

The deposition may be performed at any number of processing conditions, which may be adjusted based on the specific deposition being performed. For example, for a carbon-containing hardmask, the process may occur at a temperature above or about 600° C., above or about 650° C., or higher. Additionally, a pressure within the chamber may be maintained between about 1 and about 20 Torr, which may include any smaller range within this range, such as about 3 to about 9 Torr, for example.

Subsequent the deposition, which may be performed to any thickness, the chamber may be pumped down to remove any residual deposition precursors or deposition byproducts at optional operation 210. For example, the chamber may be pumped down to less than or about 3 Torr, less than or about 2 Torr, less than or about 1 Torr, or less, to exhaust any residual material. Additionally, a planarization operation may be performed to bring the substrate parallel, or substantially parallel, with the faceplate, such as if the substrate had been tilted during deposition. By substantially parallel is meant that perfect parallelism may not be feasible based on machine tolerances, and a margin of error is encompassed by the term to account for slight deviations from perfectly planar in relation to the faceplate. The substrate support platen 325 and the substrate may be leveled at optional operation 215, which may facilitate a subsequent translation operation.

Figure 3B:
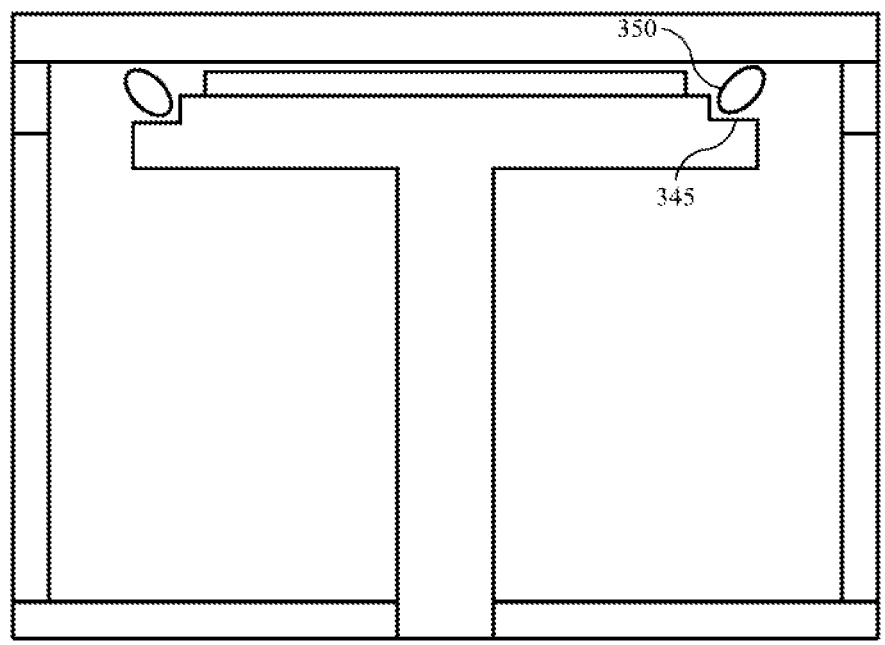
FIG. 3B shows a schematic cross-sectional view of an exemplary plasma chamber during an exemplary etching operation according to some embodiments of the present technology.

At operation 220, the substrate support may be vertically translated. For example, the substrate support may be raised towards faceplate 310, and may be moved from the first position to a second position relative to the faceplate. The second position may be closer to the faceplate in some embodiments, as illustrated in FIG. 3B, such as being a distance less than a distance between the substrate support and faceplate when the support is in the first position. The distance may be enough to limit plasma generation between the substrate and the faceplate, as will be explained further below. An etchant precursor may be flowed into the chamber in order to begin an etch process. Any number of etchant materials may be used in embodiments depending on the material to be etched. For example, for a carbon-containing film, an oxygen-containing precursor may be flowed into the chamber to be used as the etchant. Oxygen-containing precursors used in any operation as described throughout the present technology may include $O_2$, $N_2O$, $NO_2$, $O_3$, $H_2O$, ozone, as well as any other oxygen-containing precursors that may be used in film etching, or other film conversion or removal operations. In some embodiments, a remote plasma may not be formed of the etchant precursor. When remote plasmas as produced, the plasma effluents may flow through chamber components, and may be distributed uniformly across the substrate. This may etch the film in central regions as much or more than on the edge regions, where the bevel etch may be desired.

At operation 225 a plasma may be generated from the etchant precursor within the processing region of the chamber. For example, for an oxygen-containing precursor, the oxygen-containing precursor may flow into the processing region of the chamber through the faceplate. A plasma may be struck of the oxygen-containing precursor, although the plasma may be affected by the position of the substrate support. The two plasma electrodes may be or include the faceplate and the substrate support. For example, the faceplate may operate as a powered RF electrode, although in some embodiments the substrate support may be operated as the hot electrode relative to the faceplate. As noted previously, the substrate support may position the substrate at a distance from the faceplate to limit plasma generation.

Capacitively-coupled plasma may be generated between two electrodes that may be spaced beyond a distance of a plasma sheath. In a capacitive plasma, each of the electrodes may form a plasma sheath at a transition between a bulk region space and the solid surface of the electrode. Below a distance of several Debye lengths to accommodate the sheathing, a plasma may not form. Accordingly, by positioning the substrate at a distance less than several Debye lengths, a plasma may not be generated between the substrate and the faceplate.

Hence, in some embodiments, when the substrate support is in the second position, a surface of the substrate facing the faceplate may be positioned less than or about 5 mm from the faceplate, and may be positioned less than or about 4 mm from the faceplate, less than or about 3 mm from the faceplate, less than or about 2 mm from the faceplate, less than or about 1 mm from the faceplate, or less. Depending on the chamber dynamics, a plasma sheath may form across the substrate at distances from each electrode greater than or about 0.5 to about 1 mm, and thus a total distance between about 1 mm and about 2 mm between the electrodes. Consequently, by maintaining the substrate at or within this distance, a plasma may not be generated between the substrate and the faceplate.

However, for a planar substrate support or substrate support with a recessed pocket or edge ring, by so positioning the substrate support proximate the faceplate, a plasma may not generate at all within the region. Accordingly, in some embodiments a substrate support may be characterized by a recessed ledge at an edge region of the support as illustrated. By creating an edge distance that may extend beyond several Debye lengths, a plasma may be formed about the edge regions, while being limited from central regions. Consequently, an etch may be performed about the bevel and/or edge region of the substrate while substantially maintaining the rest of the formed film. The plasma formed may be characterized by an annular shape extending about the substrate, and may etch the edge material at operation 230.

As noted above, in order to generate a plasma, a distance between the recessed ledge and the faceplate may be sufficient to produce plasma while the substrate support is in the second position. Accordingly, the recess may be greater than or about 1 mm, greater than or about 2 mm, greater than or about 3 mm, greater than or about 4 mm, or greater. As illustrated in FIG. 3B, recessed ledge 345 may extend enough from the faceplate that an annular or other shaped plasma 350 may form about the substrate support. This may etch about the substrate bevel, and remove overhang of the deposited film. Additionally, by increasing the distance between the substrate and the substrate support, the generated plasma may at least partially extend radially inwards, which may allow a controlled extension of the etch on edge regions of the substrate. For example, the etch may be performed at a distance from an exterior edge of the substrate of less than or about 50 mm, and may be controlled to a distance of less than or about 45 mm, less than or about 40 mm, less than or about 35 mm, less than or about 30 mm, less than or about 25 mm, less than or about 20 mm, less than or about 15 mm, less than or about 10 mm, less than or about 5 mm, less than or about 2 mm, or less. Although plasma may diffuse to the center due to a density gradient, little may reach the center or cause beyond nominal etching of the bulk film produced.

Figure 4:
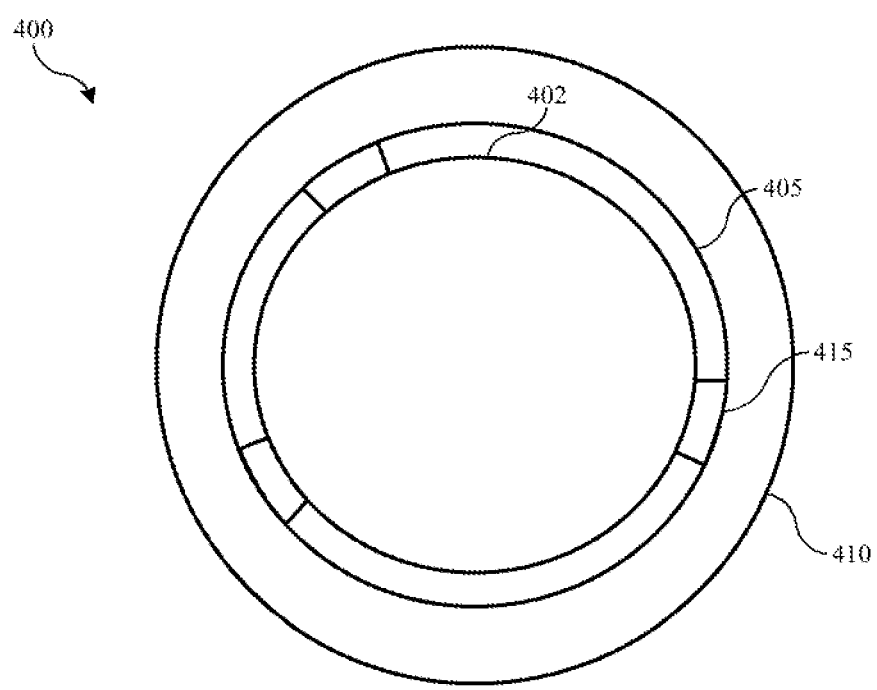
FIG. 4 shows a schematic top plan view of an exemplary substrate support according to some embodiments of the present technology.

FIG. 4 shows a schematic top plan view of an exemplary substrate support 400 according to some embodiments of the present technology. Substrate support 400 may be an additional view of any substrate support discussed elsewhere, and may be included in any chamber discussed, or any other chamber that may be used in semiconductor processing. As illustrated, substrate support 400 may seat a substrate 402 in a central region 405 of the support. Recessed ledge 410 may extend about the substrate support to produce the plasma generating region for a bevel etch. As illustrated, recessed ledge 410 may extend a distance outward from the substrate, and may extend out greater than or about 5 mm from an edge of the substrate, and may extend out greater than or about 10 mm, greater than or about 15 mm, greater than or about 20 mm, greater than or about 25 mm, greater than or about 30 mm, or greater.

Many substrate supports include a pocket for a wafer, or an edge ring, both of which may provide positional benefits, among other benefits. For example, during chamber evacuation and pressurization, without proper seating or components to maintain the substrate position, the substrate may shift or float on the substrate support, which may affect uniformity of processes on a wafer offset from a center axis. By utilizing a heater with a recessed ledge, an aspect like an edge ring or pocket may be unavailable. Accordingly, some embodiments of the present technology may incorporate positioning tabs 415, which may ensure a substrate is maintained in position during processing, even with a recessed outer ledge. Tabs may be formed or included and characterized by a limited vertical extension to limit any impact on the etch process at the bevel. Accordingly, in some embodiments the tabs may be characterized by a height above a surface on which the substrate is seated of less than or about 20 mm, and may by characterized by a height less than or about 15 mm from the surface, less than or about 12 mm, less than or about 10 mm, less than or about 9 mm, less than or about 8 mm, less than or about 7 mm, less than or about 6 mm, less than or about 5 mm, less than or about 4 mm, less than or about 3 mm, less than or about 2 mm, or less. By including a recessed ledge on a substrate support, the present technology may allow a controlled edge plasma and etch to be produced. Such a plasma may allow in situ etching to be performed in a single chamber in which a deposition has been performed on a substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   depositing a material on a substrate seated on a substrate support housed in a processing region of a semiconductor processing chamber, wherein the processing region is at least partially defined by the substrate support and a faceplate, and wherein the substrate support is at a first position within the processing region relative to the faceplate;
   translating the substrate support to a second position relative to the faceplate;
   forming a plasma of an etchant precursor within the processing region of the semiconductor processing chamber; and
   etching an edge region of the substrate.

2. The semiconductor processing method of claim 1, wherein the depositing comprises:
   delivering a carbon-containing precursor to the processing region of the semiconductor processing chamber,
   forming a plasma of the carbon-containing precursor, and
   depositing a carbon-containing material on the substrate.

3. The semiconductor processing method of claim 2, wherein the etchant precursor comprises an oxygen-containing precursor.

4. The semiconductor processing method of claim 1, wherein a distance between the substrate support and the faceplate at the second position is less than a distance between the substrate support and the faceplate at the first position.

5. The semiconductor processing method of claim 1, wherein a surface of the substrate facing the faceplate is positioned less than or about 5 mm from the faceplate when the substrate support is in the second position.

6. The semiconductor processing method of claim 1, wherein the substrate support is characterized by a recessed ledge at an exterior edge of the substrate support.

7. The semiconductor processing method of claim 6, wherein a surface of the substrate support facing the faceplate at the recessed ledge is positioned greater than or about 2 mm from the faceplate when the substrate support is in the second position.

8. The semiconductor processing method of claim 1, wherein forming the plasma of the etchant precursor comprises forming an annular plasma about an edge region of the substrate support.

9. The semiconductor processing method of claim 8, wherein etching the edge region of the substrate performs an etch substantially limited to a distance extending less than or about 50 mm from an exterior edge of the substrate.

10. A semiconductor processing method comprising:
depositing a material on a substrate seated on a substrate support housed in a processing region of a semiconductor processing chamber, wherein the processing region is at least partially defined by the substrate support and a faceplate, and wherein the substrate support is characterized by a recessed ledge at an exterior edge of the substrate support;
raising the substrate support to a position wherein a surface of the substrate facing the faceplate is positioned less than or about 5 mm from the faceplate;
forming a plasma of an etchant precursor within the processing region of the semiconductor processing chamber; and
etching an edge region of the substrate while substantially maintaining the material deposited at a central region of the substrate.

11. The semiconductor processing method of claim 10, wherein the material deposited on the substrate comprises a carbon-containing hardmask.

12. The semiconductor processing method of claim 10, wherein forming a plasma of an etchant precursor comprises:
flowing an oxygen-containing precursor into the processing region of the semiconductor processing chamber, forming a plasma of the oxygen-containing precursor, and etching the material deposited on the substrate with plasma effluents of the oxygen-containing precursor.

13. The semiconductor processing method of claim 10, wherein raising the substrate support positions the surface of the substrate facing the faceplate less than or about 2 mm from the faceplate.

14. The semiconductor processing method of claim 10, wherein forming the plasma of the etchant precursor comprises forming an annular plasma about an edge region of the substrate support.

15. The semiconductor processing method of claim 14, wherein etching the edge region of the substrate performs an etch substantially limited to a distance extending less than or about 50 mm from an exterior edge of the substrate.

16. The semiconductor processing method of claim 10, further comprising:
subsequent depositing the material, reducing a pressure in the semiconductor processing chamber to purge the processing region of the semiconductor processing chamber.

17. The semiconductor processing method of claim 10, wherein the substrate support is characterized by a tilt during deposition, and wherein the method further comprises:
leveling the substrate support so the substrate is substantially parallel with the faceplate.

18. A semiconductor processing method comprising:
forming a plasma of a carbon-containing precursor in a processing region of a semiconductor processing chamber, wherein the processing region is at least partially defined by a substrate support and a faceplate;
depositing a carbon-containing material on a substrate disposed on the substrate support, wherein the substrate support is at a first position within the processing region relative to the faceplate;
raising the substrate support to a second position relative to the faceplate;
forming an annular plasma of an oxygen-containing precursor within the processing region of the semiconductor processing chamber; and
etching an edge region of the substrate.

19. The semiconductor processing method of claim 18, wherein the substrate support comprises positioning tabs to maintain the substrate on the substrate support.

20. The semiconductor processing method of claim 18, wherein the substrate support is characterized by a recessed ledge at an exterior edge of the substrate support radially outward of a region on which the substrate is disposed, wherein a surface of the substrate facing the faceplate is less than or about 2 mm from the faceplate when the substrate support is in the second position, and wherein a surface of the substrate support facing the faceplate at the recessed ledge is greater than or about 2 mm from the faceplate when the substrate support is in the second position.

* * * * *